United States Patent
Lynn et al.

(10) Patent No.: US 12,248,979 B2
(45) Date of Patent: Mar. 11, 2025

(54) METHOD AND SYSTEM FOR PRODUCT DESIGN AND VISUALIZATION

(71) Applicant: CIMPRESS SCHWEIZ GMBH, Winterthur (CH)

(72) Inventors: Zachary Ross Lynn, Lexington, MA (US); Andrew David Batbouta, Cambridge, MA (US)

(73) Assignee: CIMPRESS SCHWEIZ GMBH, Winterthur (CH)

( * ) Notice: Subject to any disclaimer, the term of this patent is extended or adjusted under 35 U.S.C. 154(b) by 395 days.

(21) Appl. No.: 16/850,858

(22) Filed: Apr. 16, 2020

(65) Prior Publication Data
US 2020/0334741 A1 Oct. 22, 2020

Related U.S. Application Data

(60) Provisional application No. 62/834,727, filed on Apr. 16, 2019.

(51) Int. Cl.
*G06T 13/80* (2011.01)
*G06F 3/12* (2006.01)
(Continued)

(52) U.S. Cl.
CPC ....... *G06Q 30/0643* (2013.01); *G06F 3/1256* (2013.01); *G06F 3/1423* (2013.01);
(Continued)

(58) Field of Classification Search
CPC ............ G06Q 30/0643; G06Q 30/0621; G06F 3/1423; G06F 9/451; G06F 30/12;
(Continued)

(56) References Cited

U.S. PATENT DOCUMENTS 8,780,390 B2 * 7/2014 Seto ...................... G06F 3/1256
358/1.14
9,104,358 B2 * 8/2015 Rolleston .............. G06F 3/1207
(Continued)

FOREIGN PATENT DOCUMENTS

DE 102014002292 A1 * 9/2015 .............. B41F 13/54

OTHER PUBLICATIONS web.archive.org: "DaVinci Designer" Retrieved from the Internet on Aug. 11, 2020: https://web.archive.org/web/20150517001159/http:/davinci.opensoftdev.com/demo/designer/.
(Continued)

*Primary Examiner* — Kieu D Vu
*Assistant Examiner* — Blaine T Basom
(74) *Attorney, Agent, or Firm* — MARSHALL, GERSTEIN & BORUN LLP

(57) ABSTRACT

Systems and methods for rendering a product design associated with a foldable or other type of product are disclosed. According to certain aspects, an electronic device may display a foldable product within a product preview area, where the electronic device may animate the foldable product going from a folded state to an unfolded state, and vice-versa. In animating the foldable product, the electronic device may adjust the product within the product preview area and adjust a viewpoint so that the product is accurately and effectively reflected within the product preview area for a user to make an informed decision on whether to purchase the product.

5 Claims, 12 Drawing Sheets

(51) Int. Cl.
*G06F 3/14* (2006.01)
*G06F 9/451* (2018.01)
*G06F 30/12* (2020.01)
*G06Q 30/0601* (2023.01)

(52) U.S. Cl.
CPC .............. *G06F 9/451* (2018.02); *G06F 30/12* (2020.01); *G06Q 30/0621* (2013.01); *G06T 13/80* (2013.01); *G06T 2200/24* (2013.01)

(58) Field of Classification Search
CPC .... G06F 3/1446; G06F 3/1208; G06F 3/1256; G06T 13/80; G06T 2200/24; G06T 13/00
See application file for complete search history.

(56) References Cited

U.S. PATENT DOCUMENTS

| | | | | |
|---|---|---|---|---|
| 9,836,868 | B2* | 12/2017 | Rolleston | H04N 1/0044 |
| 2003/0117425 | A1* | 6/2003 | O'Leary | G06F 3/0483 |
| | | | | 715/700 |
| 2004/0177325 | A1* | 9/2004 | Keane | G06F 40/106 |
| | | | | 715/255 |
| 2005/0275879 | A1* | 12/2005 | Ogasawara | G06F 40/106 |
| | | | | 358/1.18 |
| 2012/0026522 | A1* | 2/2012 | Igawa | G06F 3/0483 |
| | | | | 358/1.13 |
| 2012/0313926 | A1* | 12/2012 | Rolleston | G06T 15/00 |
| | | | | 345/419 |
| 2013/0077113 | A1* | 3/2013 | Rolleston | G06F 3/1208 |
| | | | | 358/1.13 |
| 2014/0075361 | A1* | 3/2014 | Reynolds | G06Q 30/0603 |
| | | | | 715/771 |
| 2015/0135062 | A1* | 5/2015 | Riss | G06F 3/1208 |
| | | | | 715/246 |
| 2017/0038930 | A1* | 2/2017 | Hayakawa | G06T 11/60 |

OTHER PUBLICATIONS web.archive.org: "DaVinci; The Renaissance of Design is Happening Right Here with DaVinci" Retrieved from the Internet on Aug. 11, 2020: https://web.archive.org/web/20150517001138/https:/davinci.opensoftdev.com/demo/.

* cited by examiner

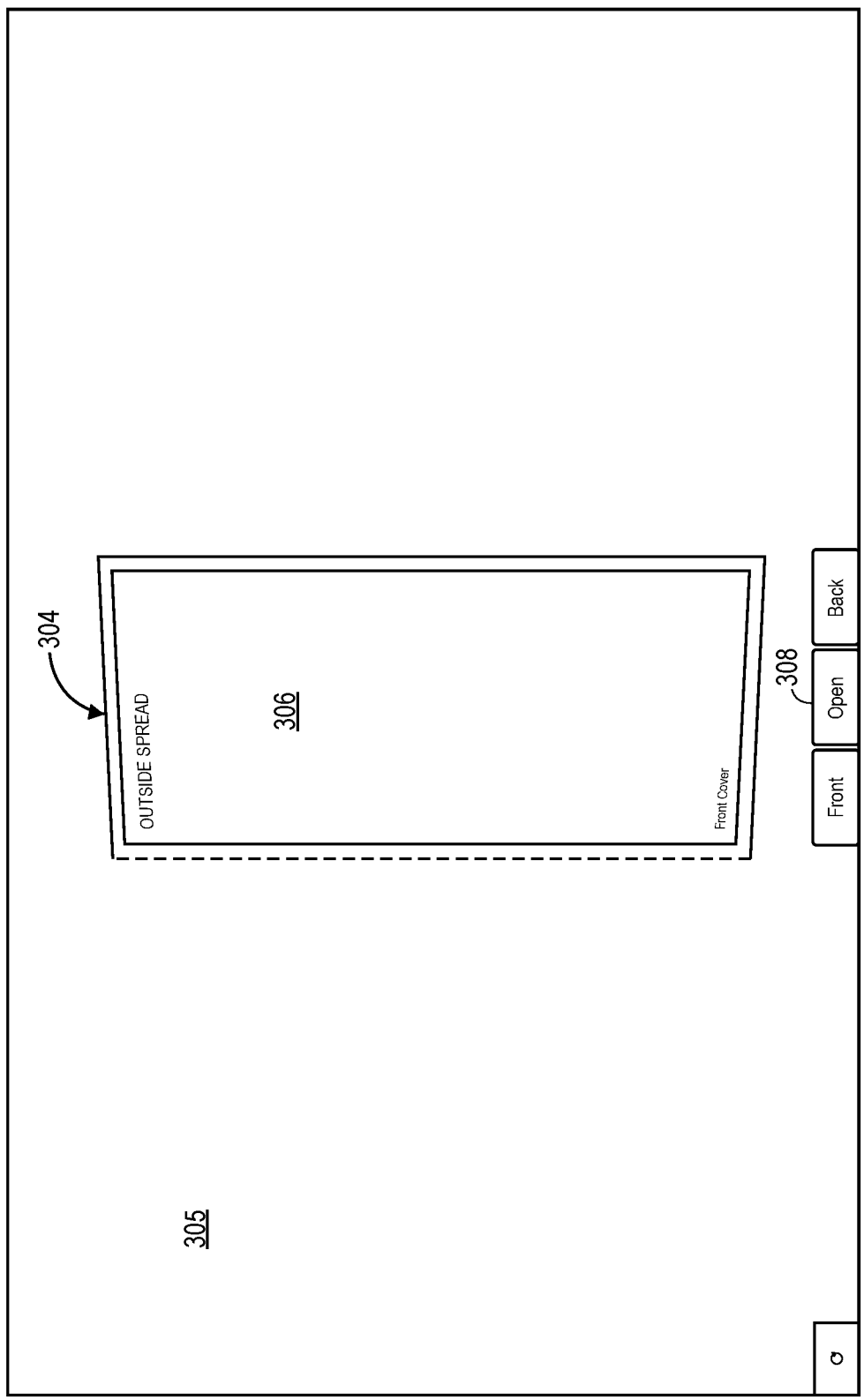

METHOD AND SYSTEM FOR PRODUCT DESIGN AND VISUALIZATION

CROSS-REFERENCE TO RELATED APPLICATIONS

This application claims priority to U.S. Patent Application No. 62/834,727, filed Apr. 16, 2019, the disclosure of which is hereby incorporated by reference in its entirety.

FIELD

The present embodiments describe technologies associated with rendering designs of products on electronic devices.

BACKGROUND

Websites having printing services allow a user to access the site from the user's home or work and design a personalized product are well known and widely used by many consumers, professionals, and businesses. The websites often allow the user to review thumbnail images of a number of customizable design templates prepared by the site operator and having a variety of different styles, formats, backgrounds, color schemes, fonts, and graphics from which the user may choose. When the user has selected a specific product design template to customize, the sites typically provide online tools allowing the user to incorporate the user's personal information and content into the selected template to create a custom design. When the design is completed to the user's satisfaction, the user can place an order through the website for production and delivery of a desired quantity of a product incorporating the corresponding customized design.

It is advantageous for printing services sites to have the image of the product that is displayed to the customer on the customer's computer or electronic display be as accurate a representation as possible of the physical product that the user will later receive. Trying to simulate on the user's electronic display both the substrate and the visual effect of areas of different or non-standard texture that are especially distinguishable from the main printed surface (i.e., the substrate) at different angles of lighting has historically posed a problem. Some types of textured premium finishes that elicit differing lighting effects, including foil, gloss, raised print, embossment, vinyl, leather, cloth, and other textured finishes, which are to be applied in the creation of a finished product (such as a printed document) change in appearance depending on how light reflects off the premium finish surface. The appearance changes as either or both of the product itself or the illuminating light source moves. Additionally, products that incorporate folds are difficult to accurately render within on the electronic display, especially animating the folding and unfolding of such products. If upon delivery the delivered final product does not appear how the user imagined it would, this can lead to customer dissatisfaction and refund requests.

Therefore, there is an opportunity for systems and methods to accurately and effectively render products within an electronic display of a customer, including accurately and effectively rendering various folding, texture, and lighting features of products.

SUMMARY

In an embodiment, a method on a computing device rendering a product design associated with a foldable product having a front cover and a plurality of panels is provided. The method may include: displaying, in a user interface of the computing device, (i) a product preview area displaying the product design in a folded state with the front cover visible and substantially centered within the product preview area, and (ii) a set of folding effect selections; receiving, via the user interface, an open selection of the set of folding effect selections; and in response to receiving the open selection, animating the product design from the folded state to an unfolded state, including: adjusting the product design within the product preview area, opening the front cover of the foldable product to display an inside surface opposite from the front cover, and displaying the plurality of panels of the foldable product; wherein when the product design is displayed in the unfolded state, the plurality of panels are substantially centered within the product preview area.

In another embodiment, a system for rendering a product design associated with a foldable product having a front cover and a plurality of panels is provided. The system comprises a user interface for displaying a product preview area, a memory storing a set of computer-executable instructions, and a processor interfacing with the user interface and the memory. The processor is configured to execute the set of computer-executable instructions to cause the processor to: cause the user interface to display (i) the product preview area displaying the product design in a folded state with the front cover visible and substantially centered within the product preview area, and (ii) a set of folding effect selections, receive, via the user interface, an open selection of the set of folding effect selections, and in response to receiving the open selection, cause the user interface to animate the product design from the folded state to an unfolded state, including: adjusting the product design within the product preview area, opening the front cover of the foldable product to display an inside surface opposite from the front cover, and displaying the plurality of panels of the foldable product; wherein when the product design is displayed in the unfolded state, the plurality of panels are substantially centered within the product preview area.

In a further embodiment, a non-transitory computer-readable storage medium having stored thereon a set of instructions, executable by a processor, for rendering a product design associated with a foldable product having a front cover and a plurality of panels, is provided. The instructions may include: instructions for displaying, in a user interface, (i) a product preview area displaying the product design in a folded state with the front cover visible and substantially centered within the product preview area, and (ii) a set of folding effect selections; instructions for receiving, via the user interface, an open selection of the set of folding effect selections; and instructions for, in response to receiving the open selection, animating the product design from the folded state to an unfolded state, including: instructions for adjusting the product design within the product preview area, instructions for opening the front cover of the foldable product to display an inside surface opposite from the front cover, and instructions displaying the plurality of panels of the foldable product; wherein when the product design is displayed in the unfolded state, the plurality of panels are substantially centered within the product preview area.

BRIEF DESCRIPTION OF THE FIGURES

FIGS. 3A-3G illustrate example animations and renderings of a foldable product, in accordance with some embodiments.

DETAILED DESCRIPTION

The present embodiments offer improved display technologies associated with product visualization. In particular, the present embodiments realistically animate the folding and unfolding of foldable products while keeping the foldable products within a displayable area. Additionally, the present embodiments effectively simulate natural effects such as light scattering, and accurately represent certain areas (e.g., areas containing foil) as they are actually implemented as a physical product. Moreover, the present embodiments accurately represent certain premium finishes on products, and simulate movement of light across the images of the simulated products.

The systems and methods therefore offer numerous benefits. In particular, the systems and methods accurately reflect, within an electronic display of a consumer, how a product actually looks and how the product may be maneuvered, which helps the consumer make a more informed decision as to whether to purchase the product. This may increase customer satisfaction, as well as reduce instances of consumer complaints, product returns, and refund requests. Accordingly, companies that fulfill customer orders or otherwise produce the products may realize reduced costs, greater profits, and increased sales. It should be appreciated that additional benefits are envisioned.

The systems and methods discussed herein improve the functioning of a computer as well as virtual design platforms. Conventionally, rendered products are not animated to accurately depict how a foldable product is folded or unfolded. For example, there are challenges associated with ensuring that a foldable product is consistently and completely depicted within a viewing area, especially when the product is being animated from a folded to unfolded state, and vice-versa. Additionally, conventional platforms are unable to accurately depict finishes of products and/or how products realistically appear in different lighting settings. The systems and methods are an improvement to how the computer modifies virtual designs because the systems and methods automatically and dynamically adjust foldable products during animation of the products between and among different folding states, and adjust other products to reflect certain finishes and lighting conditions.

The following U.S. Patents and published applications, each of which is owned by the same assignee of interest of the present application, are hereby incorporated by reference in their entireties: U.S. Pat. Nos. 7,644,355, 8,818,773, and U.S. Patent Publication No. 2013/0335437.

Figure 1:
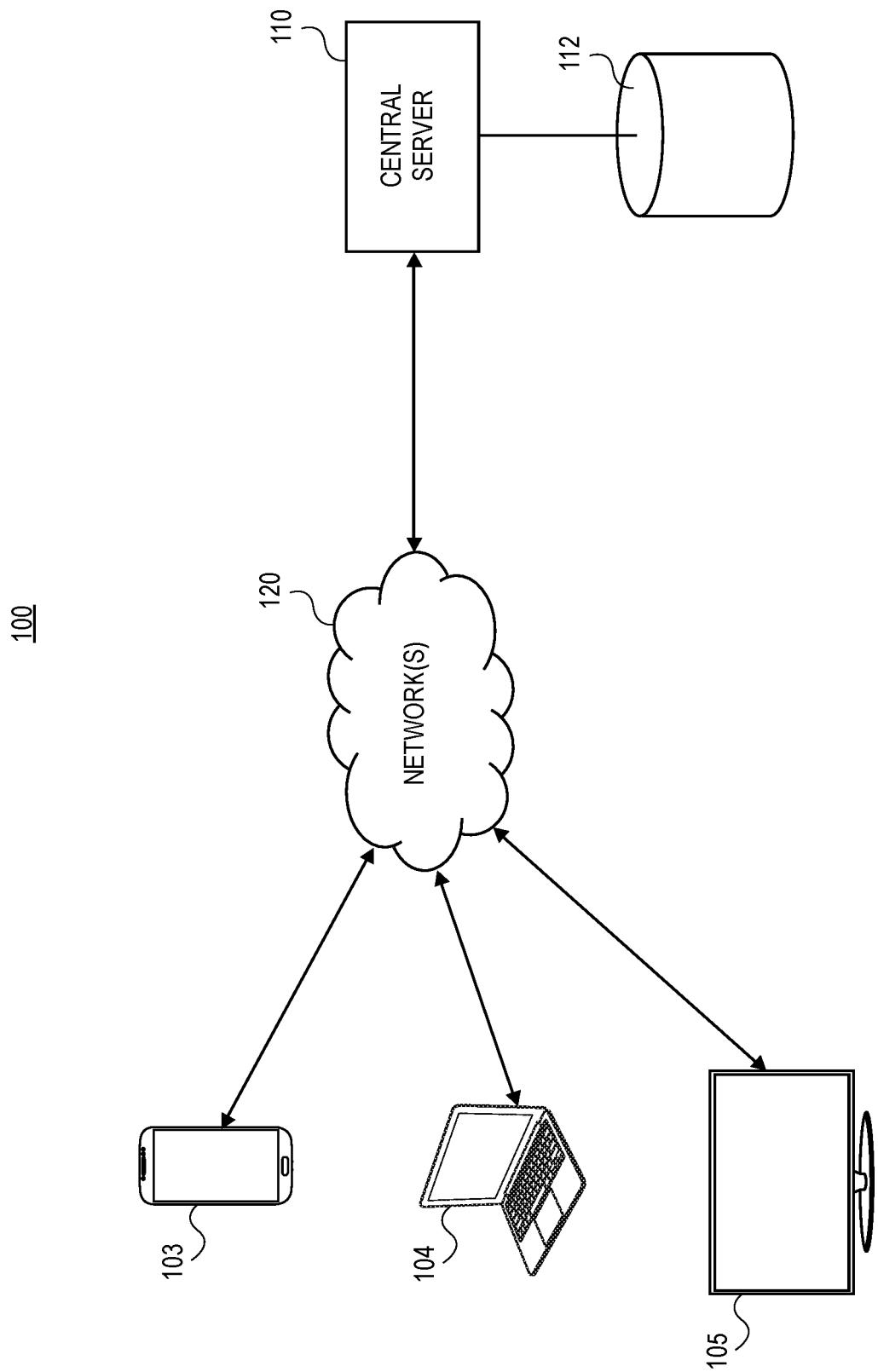
FIG. 1 depicts an overview of components and entities associated with the systems and methods, in accordance with some embodiments.

FIG. 1 illustrates an overview of a system 100 of components configured to facilitate the systems and methods. It should be appreciated that the system 100 is merely an example and that alternative or additional components are envisioned.

As illustrated in FIG. 1, the system 100 may include a set of electronic devices 103, 104, 105 which may be used or operated by a set of users, such as any individual or person who may be interested in purchasing items, products, and/or services that may be offered for sale by an entity. In an embodiment, the entity may be a corporation, company, partnership, retailer, wholesaler operating on behalf of another entity (e.g., a white label wholesaler), or the like, where the entity may offer an e-commerce platform (e.g., a website accessible by or an application executable by the electronic devices 103, 104 105) and optionally a set of brick-and-mortal retail stores. Each of the electronic devices 103, 104, 105 may be any type of electronic device such as a mobile device (e.g., a smartphone), desktop computer, notebook computer, tablet, phablet, GPS (Global Positioning System) or GPS-enabled device, smart watch, smart glasses, smart bracelet, wearable electronic, PDA (personal digital assistant), pager, computing device configured for wireless communication, and/or the like.

The electronic devices 103, 104, 105 may communicate with a central server 110 via one or more networks 120. The central server 110 may be associated with the entity that owns and/or manages the e-commerce platform(s) and/or the set of brick-and-mortal retail stores. In particular, the central server 110 may include or support a web server configured to host a website that offers various products and/or services for purchase by users. Further, the central server 110 may support a software application executable by the set of electronic devices 103, 104, 105 (i.e., the set of electronic devices 103, 104, 105 may interface with the central server 110 in executing the software application). In embodiments, the network(s) 120 may support any type of data communication via any standard or technology (e.g., GSM, CDMA, TDMA, WCDMA, LTE, EDGE, OFDM, GPRS, EV-DO, UWB, Internet, IEEE 802 including Ethernet, WiMAX, Wi-Fi, Bluetooth, and others).

Although depicted as a single central server 110 in FIG. 1A, it should be appreciated that the server 110 may be in the form of a distributed cluster of computers, servers, machines, or the like. In this implementation, the entity may utilize the distributed server(s) 110 as part of an on-demand cloud computing platform. Accordingly, when the electronic devices 103, 104, 105 interface with the server 110, the electronic devices 103, 104, 105 may actually interface with one or more of a number of distributed computers, servers, machines, or the like, to facilitate the described functionalities.

The central server 110 may be configured to interface with or support a memory or storage 112 capable of storing various data, such as in one or more databases or other forms of storage. According to embodiments, the storage 112 may store data or information associated with products or services that are offered for sale by the entity that owns and/or manages the e-commerce platform and/or the set of brick-and-mortal retail stores. For example, the storage 112 may store information associated with office supplies such as business cards and notepads, including information associated with a customer or client (e.g., company name and logo). For further example, the storage 112 may store templates of designs, as well as information associated with the designs, including properties and dimensions of the elements/components of the designs.

Although three (3) electronic devices 103, 104, 105, and one (1) server 110 are depicted in FIG. 1A, it should be appreciated that greater or fewer amounts are envisioned. For example, there may be multiple central servers, each one associated with a different entity. Additionally, the electronic devices 103, 104, 105 and the central server 110 may interface with one or more separate, third-party servers (not depicted in FIG. 1A) to retrieve relevant data and information.

Each of the electronic devices 103, 104, 105 may be configured with a user interface capable of displaying content, receiving selections from respective users, and facilitating other functionalities. According to embodiments, users of the electronic devices 103, 104, 105 may select a design(s) of a product to preview and modify using the electronic devices 103, 104, 105, such as in contemplation of placing an order for the product(s). Certain product(s) may have different amounts of panels. For example, a bi-fold product has two (2) panels, a tri-fold product has three (3) panels, and a four panel fold product has four (4) panels. Further, different products may have different folding configurations, which may be determined by a folding bias between two adjacent panels. For example, a bi-fold product may have a horizontal fold configuration or a vertical fold configuration, a tri-fold product may have a roll fold configuration, a Z-fold configuration, or a gate fold configuration, and a four panel fold product may have a roll fold configuration, an accordion fold configuration, or a parallel fold configuration. It should be appreciated that alternative and additional configurations and amounts of panels are envisioned.

According to embodiments, users of the electronic devices 103, 104, 105 may select products with varying amounts of panels and folding configurations, for preview in the user interface. A rendering application that is executable by the electronic devices 103, 104, 105 may be configured to animate and render the products being folded and unfolded according to the selections. The rendering application may facilitate the animations and renderings in such a way that the products may be accurately visualized in an efficient and effective manner. These functionalities are further described and illustrated in various of the following figures.

Figure 2A:
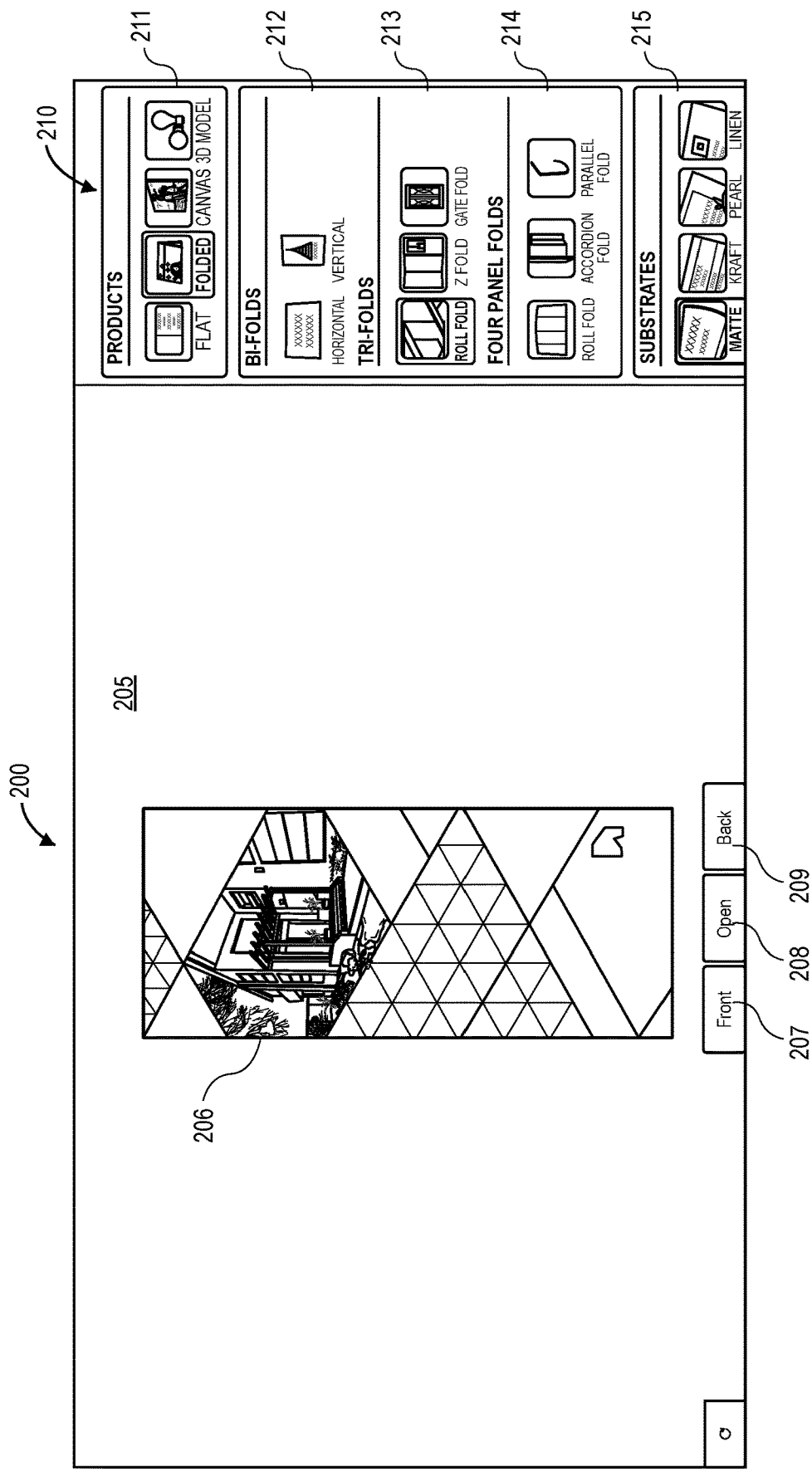
FIGS. 2A and 2B illustrate example user interfaces associated with rendering a product and selections associated with the product rendering, in accordance with some embodiments.

FIG. 2A illustrates an example interface 200 comprising a product preview area 205 and a selection area 210. The product preview area 205 depicts a product 206, a front selection 207 (to cause the front of the product 206 to be displayed), an open selection 208 (to cause the product 206 to be opened or unfolded), and a back selection 209 (to cause the back of the product 206 to be displayed). The selection area 210 comprises various selection areas, including a product selection area 211 that may enable a user to select a certain product, a bi-fold selection area 212 that may enable the user to select a type of bi-fold configuration, a tri-fold selection area 213 that may enable the user to select a type of tri-fold configuration, a four panel fold selection area 214 that may enable the user to select a type of four panel fold configuration, and a substrate selection area 215 that may enable the user to select a type of substrate for the product.

Figure 2B:
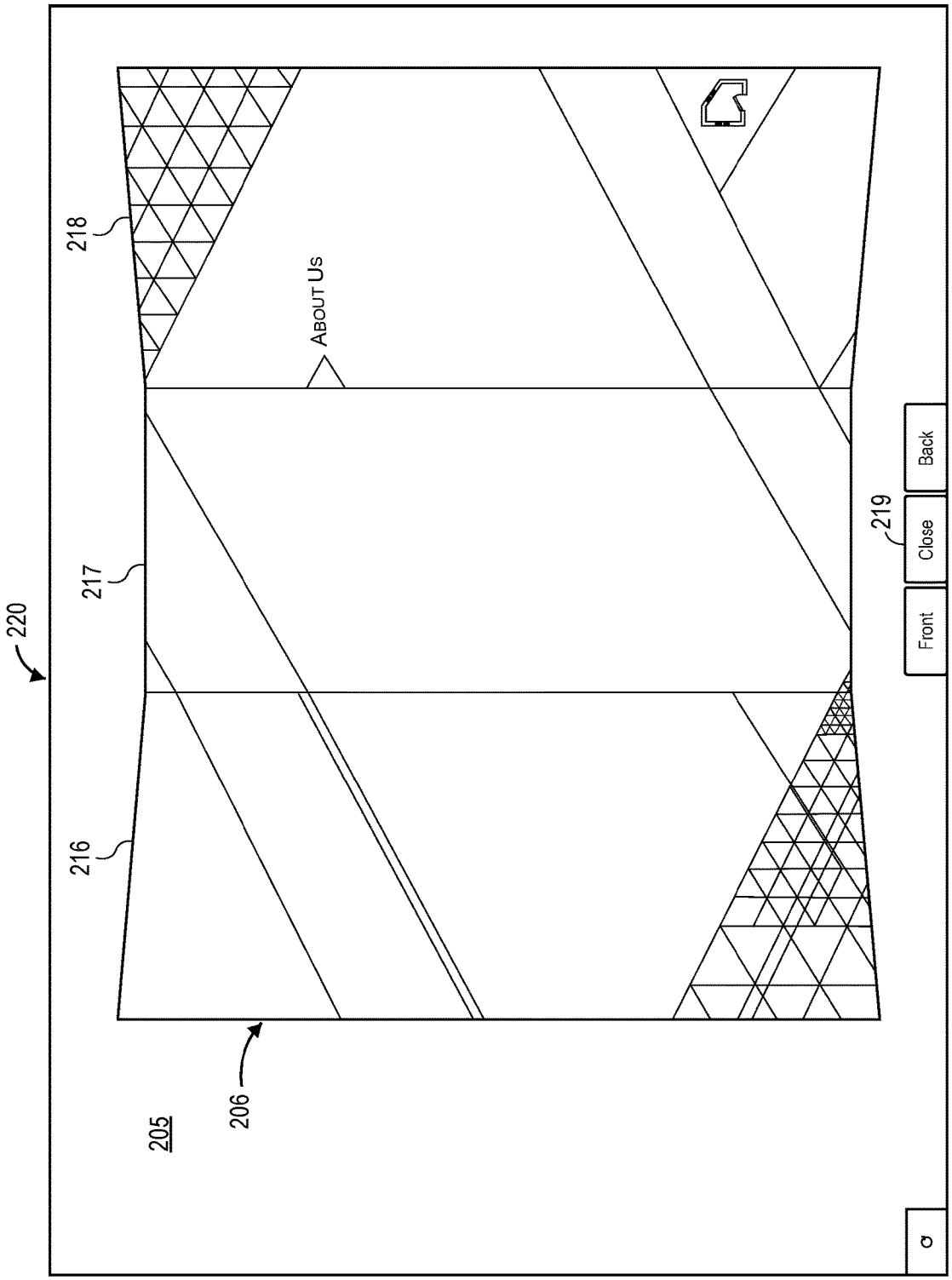

FIG. 2B depicts an example interface 220 showing the product 206 in an open or unfolded state in the product preview area 205, where the product 206 is composed of three panels and has a roll fold configuration. In particular, the product 206 may have a left panel 216, a center panel 217, and a right panel 218. To undertake the roll fold, the right panel 218 may be initially be folded on top of the center panel 217, and the left panel 216 may then be folded on top of the right panel 218 (and therefore, the center panel 217 as well), resulting in the folded configuration that is illustrated in FIG. 2A.

Because the left panel 216 and the right panel 218 are folding "into" each other, a rendering application may deem these panels 216, 218 to occupy the same space. However, the rendering application may not be able to determine which of the panels 216, 218 to display as part of the rendering (or, may display the wrong panel (e.g., the right panel 218) that creates an undesired rendering).

According to embodiments, the systems and methods may modify a thickness of one or more of the panels 216, 217, 218. In particular, the rendering application may increase the thickness of the left panel 216, such that when the left panel 216 is folded over the right panel 218 (as well as the center panel 217), the rendering application may determine that the thickness of the left panel 216 is greater than that of the right panel 218 and the center panel 217, and therefore correctly depict the left panel 216 covering or on top of the right panel 218 and the center panel 217. Alternatively or additionally, the rendering application may reduce a thickness of at least one of the panels 217, 218.

Generally, a folded product may include at least two panels or portions, where the rendering application identify or determine how a product is to be maneuvered/folded, and in particular, which panels or portion are to be maneuvered/folded on top of which other panels. Each of the panels may have a thickness, where the thickness may be the same or different between or among the panels. Based on how the product is to be maneuvered/folded, the rendering application may further modify or adjust the thickness of one or more of the panels. For example, the rendering application may increase the thickness of the panel that is to be rendered at the front or on top of the folded product. For further example, the rendering application may reduce the thickness of one or more panels that are to be rendered not at the front or on top of the folded product (with or without increasing the thickness of the panel that is to be rendered at the front or on top of the folded product).

In additional embodiments, the systems and methods may facilitate various technologies associated with rendering products and animations or effects associated with rendering products. In particular, the systems and methods may facilitate technologies associated with animating a product being folded or unfolded.

FIG. 3A depicts a foldable product 304 in a product preview area 305 that, in this embodiment, has four panels. As depicted in FIG. 3A, a front cover 306 of the foldable product 304 is displayed in a user interface such that a height of the foldable product 304 is able to extend near the top and bottom of the product preview area 305. However, if the foldable product 304 were to be rendered in an unfolded state, the entire foldable product 304 would not be able to be displayed in the aspect ratio and product position that is depicted in FIG. 3A. Accordingly, the rendering application may make adjustments to the aspect ratio, the point of perspective, the depth, and other factors when animating the unfolding and re-folding of the foldable product 304.

As discussed herein, the product may be foldable according to various configurations, such as roll fold, accordion fold, Z fold, parallel fold, or others. Each respective configuration dictates the bias of each fold as well as how the products are folded and unfolded. Further, the rendering application may animate the product being unfolded from the folded state to the unfolded state or being folded from the unfolded state to the folded state, where the animation may vary based on the type of folding configuration. In embodiments, the rendering application may initiate the unfolding animation in response to a user of the rendering application selecting the open selection 308 as depicted in FIG. 3.

Similarly, the rendering application may initiate the folding animation in response to the user selecting a close selection 219 as depicted in FIG. 2B.

Figure 3B:
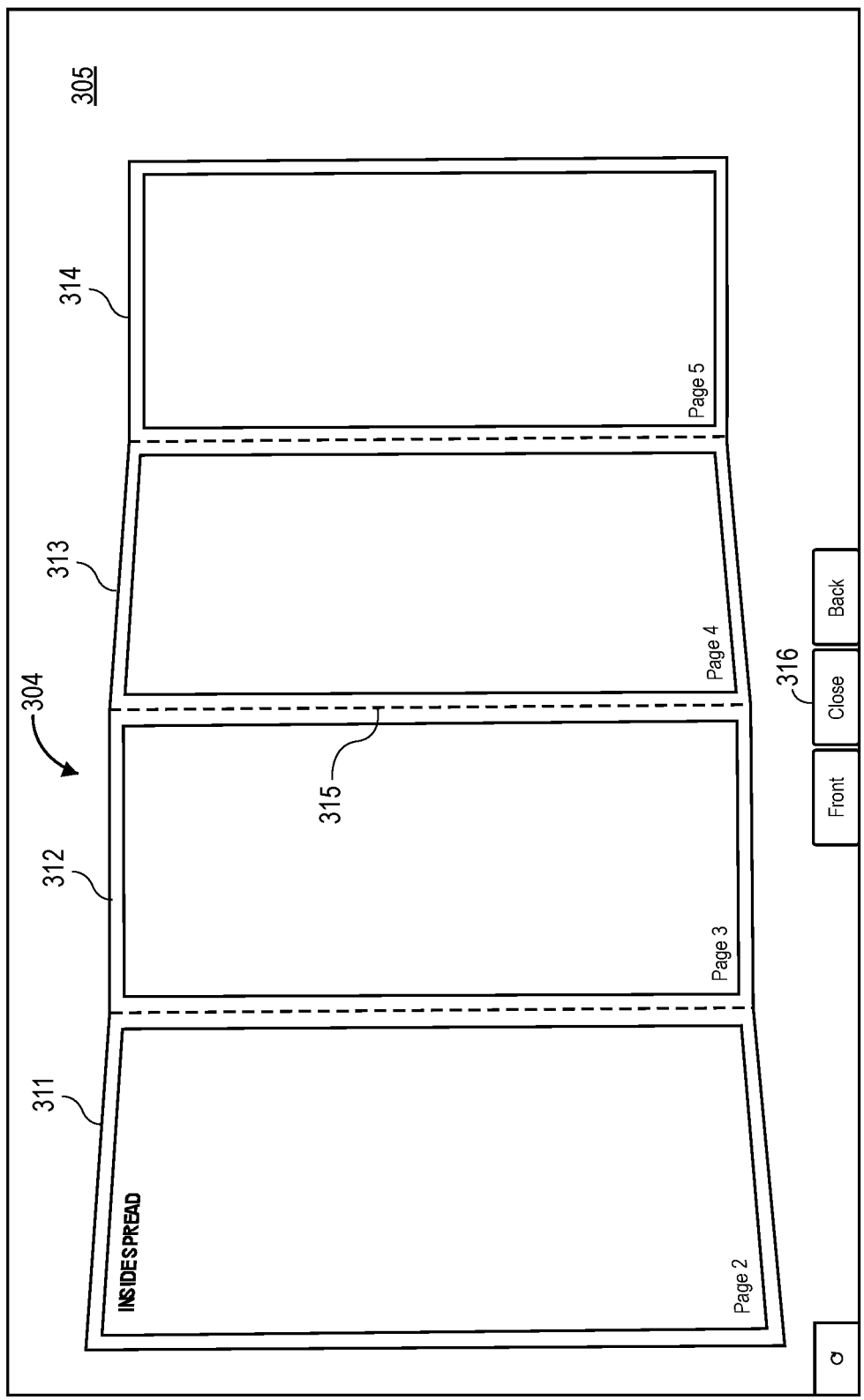

FIG. 3B depicts the product 304 in an unfolded state in the product preview area 305 and having the accordion fold configuration. The product 304 in the unfolded state comprises four panels: a first panel 311 (depicting an inside spread on the side opposite from the front cover 306), a second panel 312, a third panel 313, and a fourth panel 314 (depicting an internal spread on the side opposite from the back cover of the product 304).

Figure 3C:
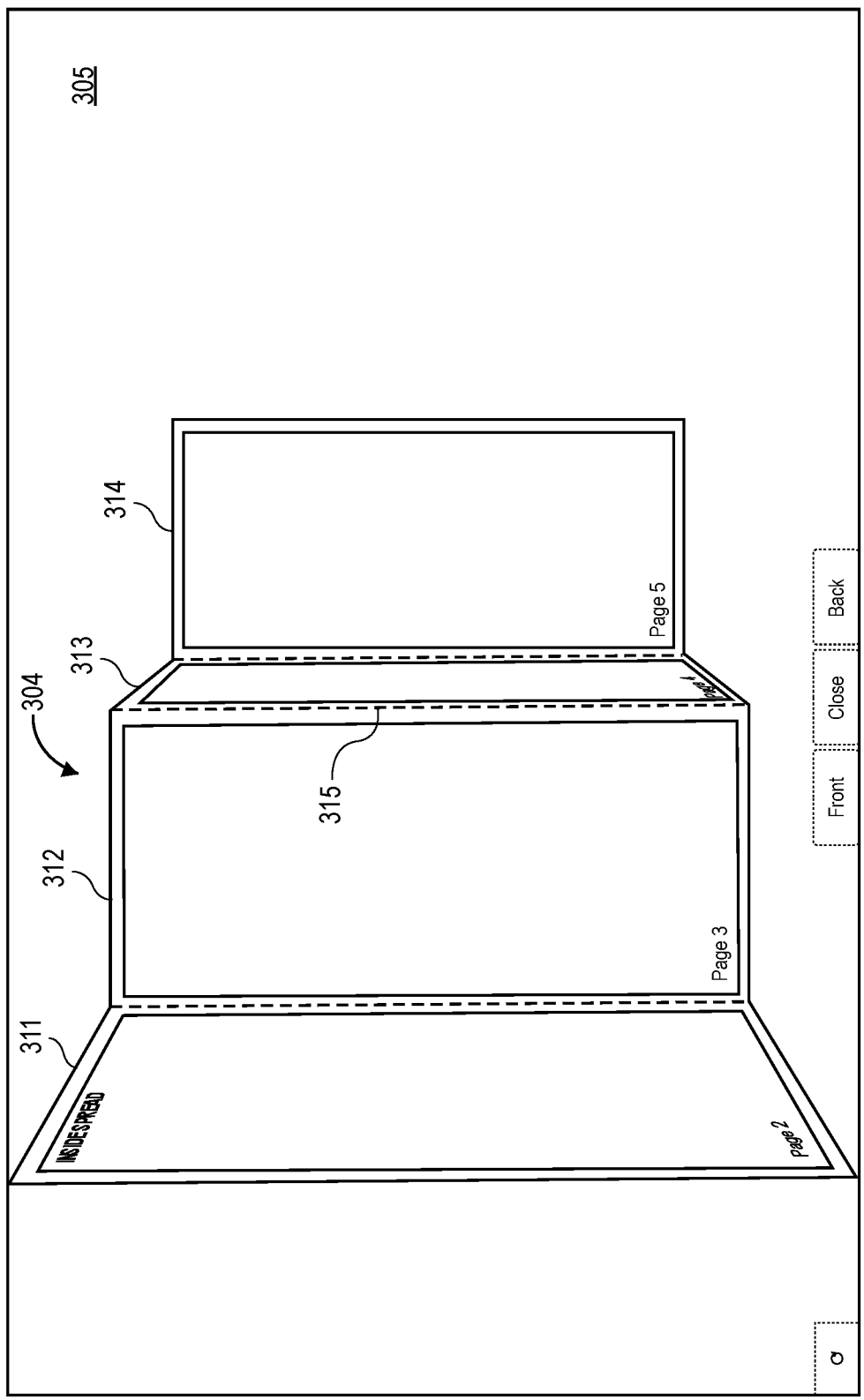

Initially, in animating the product 304 having the accordion fold configuration transitioning from the folded state to the unfolded state, the rendering application may simultaneously or sequentially (i) move the product 304 to the left (i.e., by moving the perspective or origin point of the virtual camera to the right), and (ii) unfold the front cover 306 as part of the first panel 311. Accordingly, the first panel 311 and the second panel 312 may be displayed within a first side of the product preview area 305. Subsequently or simultaneously, the rendering application may animate the third panel 313 and the fourth panel 314 being unfolded from under a center fold 315 of the product 304 such that the third panel 313 and the fourth panel 314 are displayed within a second side of the product preview area 305 opposite from the first side. These effects are illustrated in FIG. 3C. By initially moving the product 304 to the left, the rendering application may enable the third panel 313 and the fourth panel 314 to be displayed completely within the product preview area 305 (and in particular, within the second side of the product preview area 305).

Similarly, the rendering application may animate the product 304 having the accordion fold configuration being folded from the unfolded state to the folded state, such as in response to the user selecting a close selection 316 as depicted in FIG. 3B. Initially, the rendering application may simultaneously or sequentially (i) move the product 304 to the right (i.e., by moving the perspective or origin point of the virtual camera to the left), and (ii) fold the first panel 311 so that the front cover 306 is visible. Subsequently or simultaneously, the rendering application may animate the third panel 313 and the fourth panel 14 being folded along the center fold 315 and back underneath the first panel 311 and the second panel 312. By moving the product 304 to the right, the rendering application may enable the product 304 to be rendered in the center of the product preview area 305 when the product 304 is in the folded state.

Figure 3D:
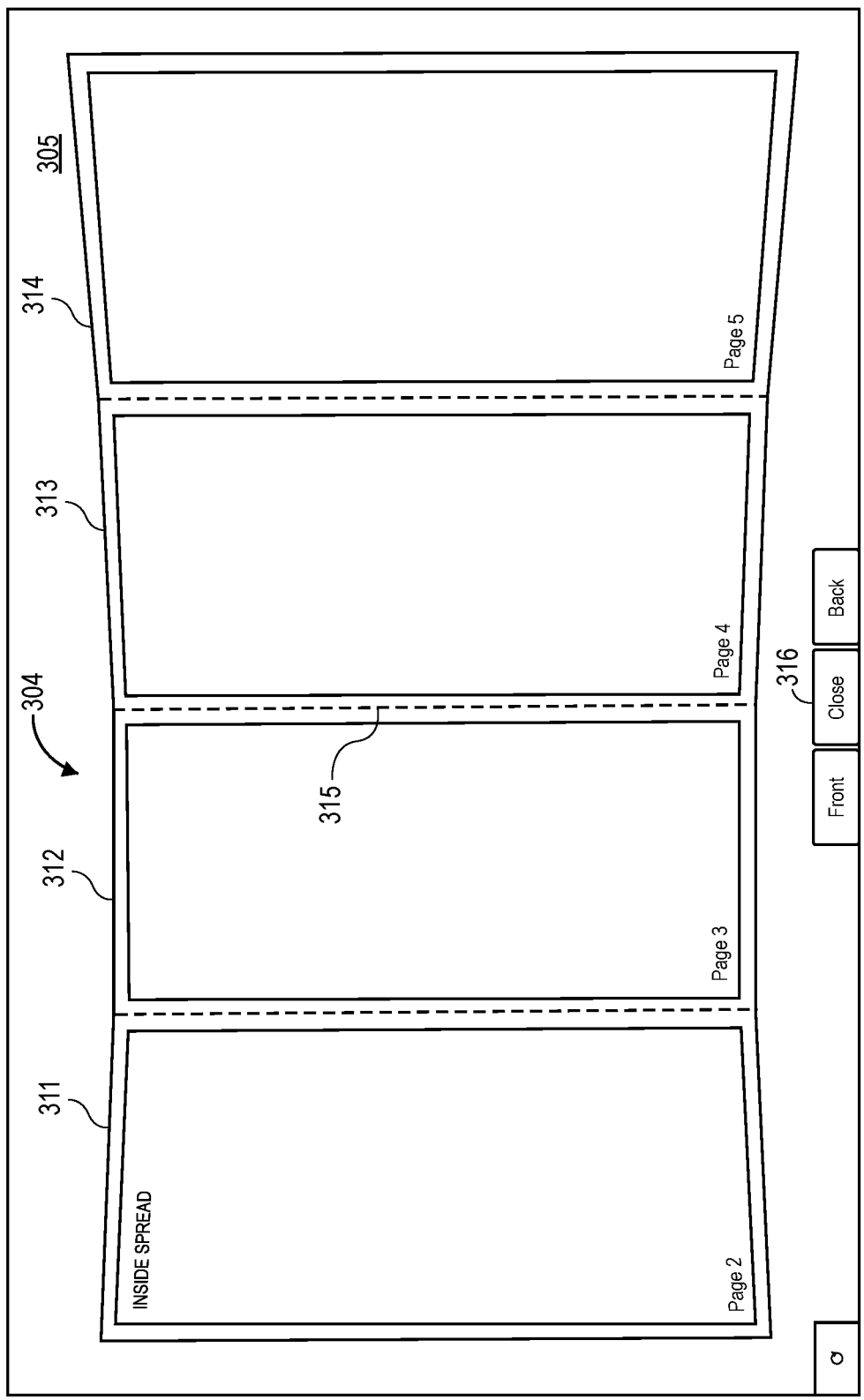

FIG. 3D depicts the product 304 in an unfolded state in the product preview area 305 and having the roll fold configuration. The product 304 in the unfolded state comprises four panels: the first panel 311 (depicting an inside spread on the side opposite from the front cover 306), the second panel 312, the third panel 313, and the fourth panel 314.

Figure 3E:
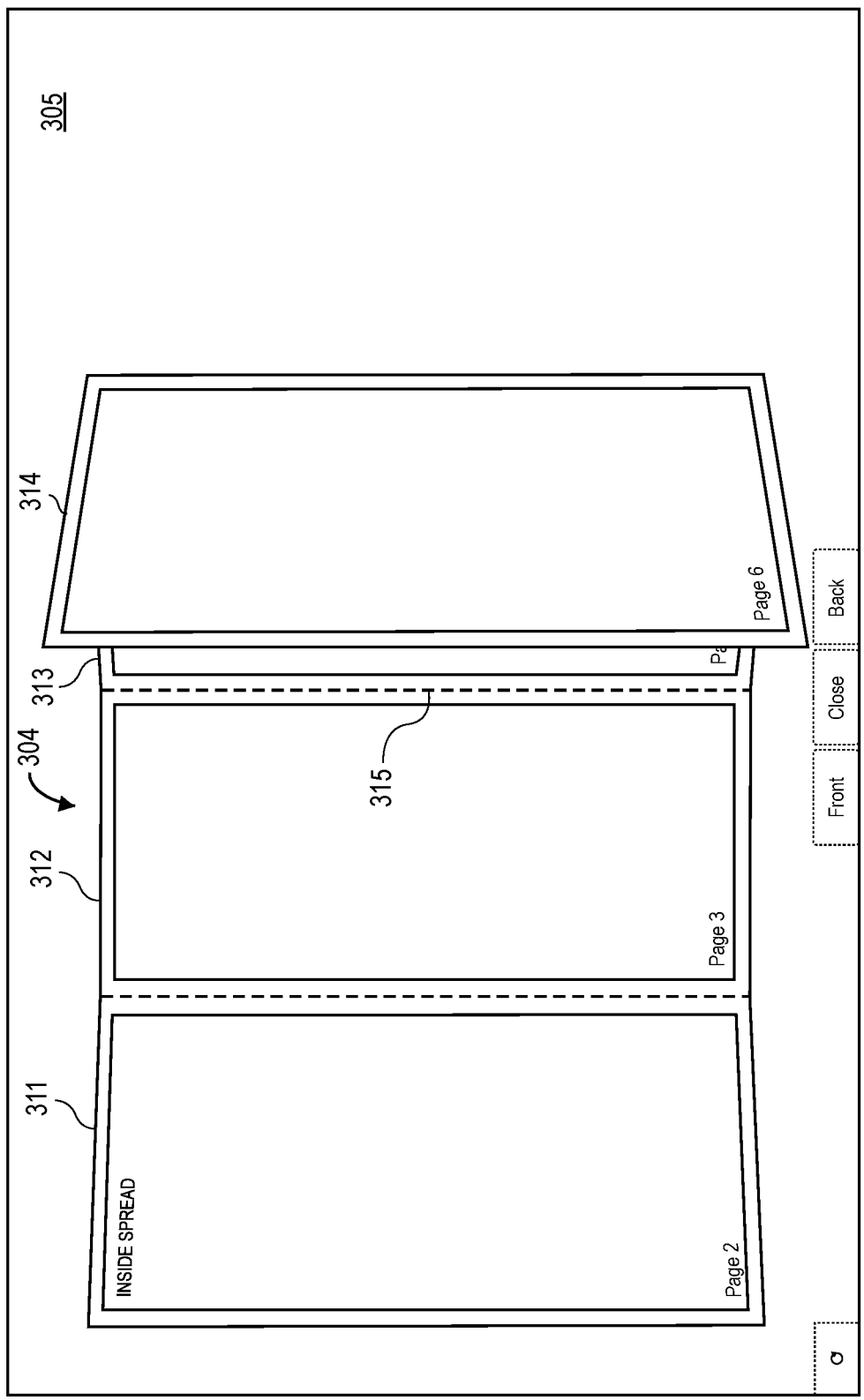

Initially, in animating the product 304 having the roll fold configuration transitioning from the folded state to the unfolded state, the rendering application may simultaneously or sequentially (i) move the product 304 to the left (i.e., by moving the perspective or origin point of the virtual camera to the right), and (ii) unfold the front cover 306 as part of the first panel 311, such that the entire product 304 may be displayed within the first side of the product preview area 305. Simultaneously or subsequently, the rendering application may animate the third panel 313 and the fourth panel 314 being unfolded, together, from the center fold 315. Simultaneously or subsequently, the rendering application may animate the fourth panel 314 being unfolded from the third panel 313 such that the first panel 311 and the second panel 312 are displayed within a first side of the product preview area 305, and the third panel 313 and the fourth panel 314 are displayed within a second side of the product preview area 305 opposite from the first side. These effects are illustrated in FIG. 3E. By initially moving the product 304 to the left, the rendering application may enable the third panel 313 and the fourth panel 414 to be displayed completely within the product preview area 305 (and in particular, within the second side of the product preview area 305).

Similarly, the rendering application may animate the product 304 having the roll fold configuration being folded from the unfolded state to the folded state, such as in response to the user selecting the close selection 316 as depicted in FIG. 3D. Initially, the rendering application may simultaneously or sequentially (i) animate the fourth panel 314 being folded on the third panel 313, (ii) animate the third panel 313 and the fourth panel 314 being folded, together, along the center fold 315 and on top of the second panel 312, (iii) animate the first panel 311 being folded on top the other three panels 312, 313, 314, and (iv) move the product 304 to the right (i.e., by moving the perspective or origin point of the virtual camera to the left). By moving the product 304 to the right, the rendering application may enable the product 304 to be rendered in the center of the product preview area 305 when the product 304 is in the folded state.

Figure 3F:
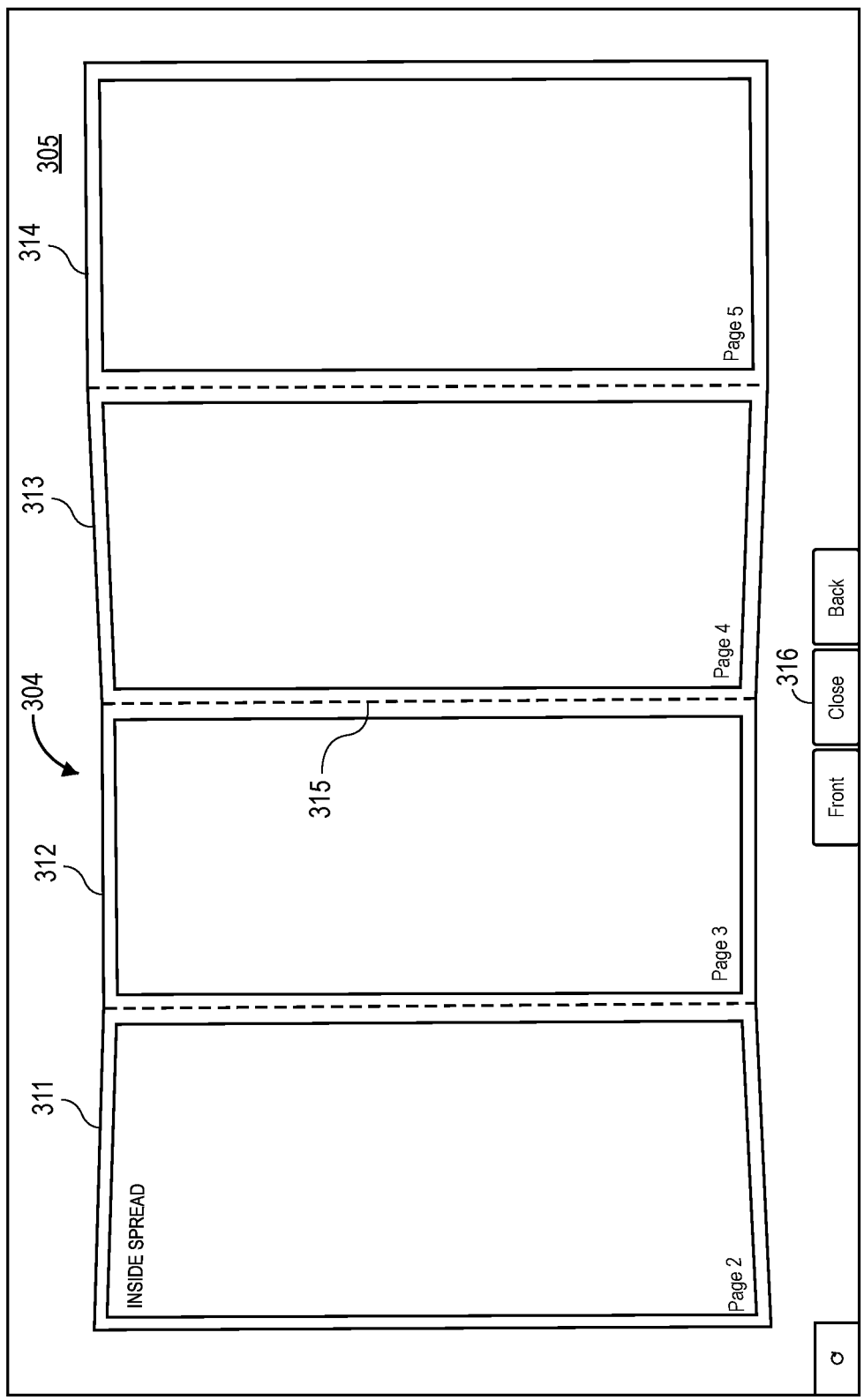

FIG. 3F depicts the product 304 in an unfolded state in the product preview area 305 and having the parallel fold configuration. The product 304 in the unfolded state comprises four panels: the first panel 311 (depicting an inside spread on the side opposite from the front cover 306), the second panel 312, the third panel 313, and the fourth panel 314.

Figure 3G:
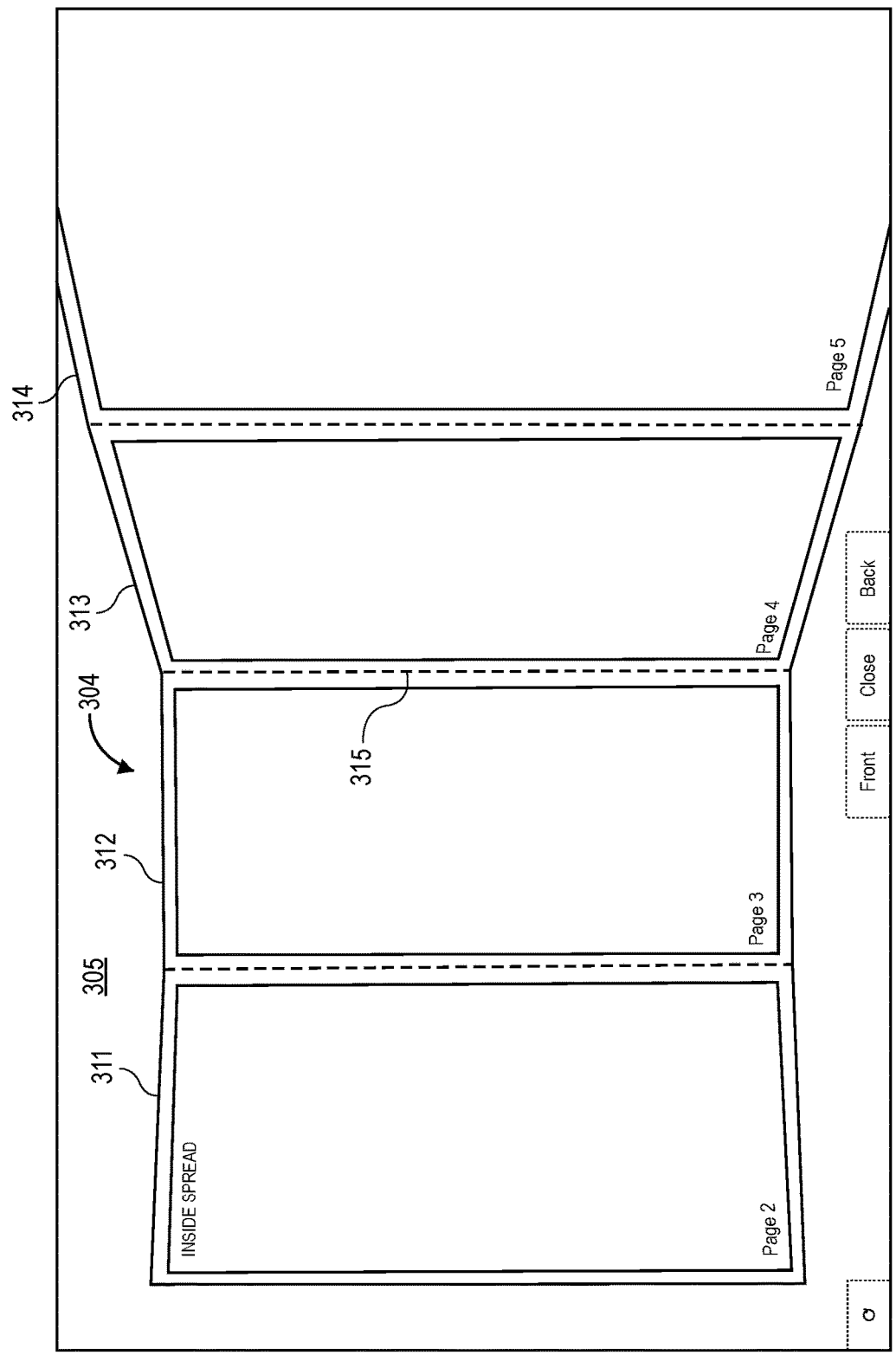

Initially, in animating the product 304 having the parallel fold configuration transitioning from the folded state to the unfolded state, the rendering application may simultaneously or sequentially (i) move the product 304 to the left (i.e., by moving the perspective or origin point of the virtual camera to the right), and (ii) unfold the first panel 311 together with the fourth panel 314, such that the fourth panel 314 is on top of the first panel 311 and the third panel 313 is on top of the second panel 312, and such that the entire product 304 may be displayed within the first side of the product preview area 305. Simultaneously or subsequently, the rendering application may animate the third panel 313 and the fourth panel 314 being unfolded, side-by-side, from the center fold 315, such that the first panel 311 and the second panel 312 are displayed within a first side of the product preview area 305, and the third panel 313 and the fourth panel 314 are displayed within a second side of the product preview area 305 opposite from the first side. These effects are illustrated in FIG. 3G. By initially moving the product 304 to the left, the rendering application may enable the third panel 313 and the fourth panel 314 to be displayed completely within the product preview area 305 (and in particular, within the second side of the product preview area 305).

Similarly, the rendering application may animate the product 304 having the parallel fold configuration being folded from the unfolded state to the folded state, such as in response to the user selecting the close selection 316 as depicted in FIG. 3F. Initially, the rendering application may simultaneously or sequentially (i) animate the fourth panel 314 side-by-side with the third panel 313 being folded along the center line 315 on top of the first panel 311 and the second panel 312, respectively, (ii) animate the fourth panel 314 and the first panel 311 being folded, together, on top of the third panel 313 and the second panel 312, and (iii) move the product 304 to the right (i.e., by moving the perspective or origin point of the virtual camera to the left). By moving the product 304 to the right, the rendering application may enable the product 304 to be rendered in the center of the product preview area 304 when the product 304 is in the folded state.

Figure 4:
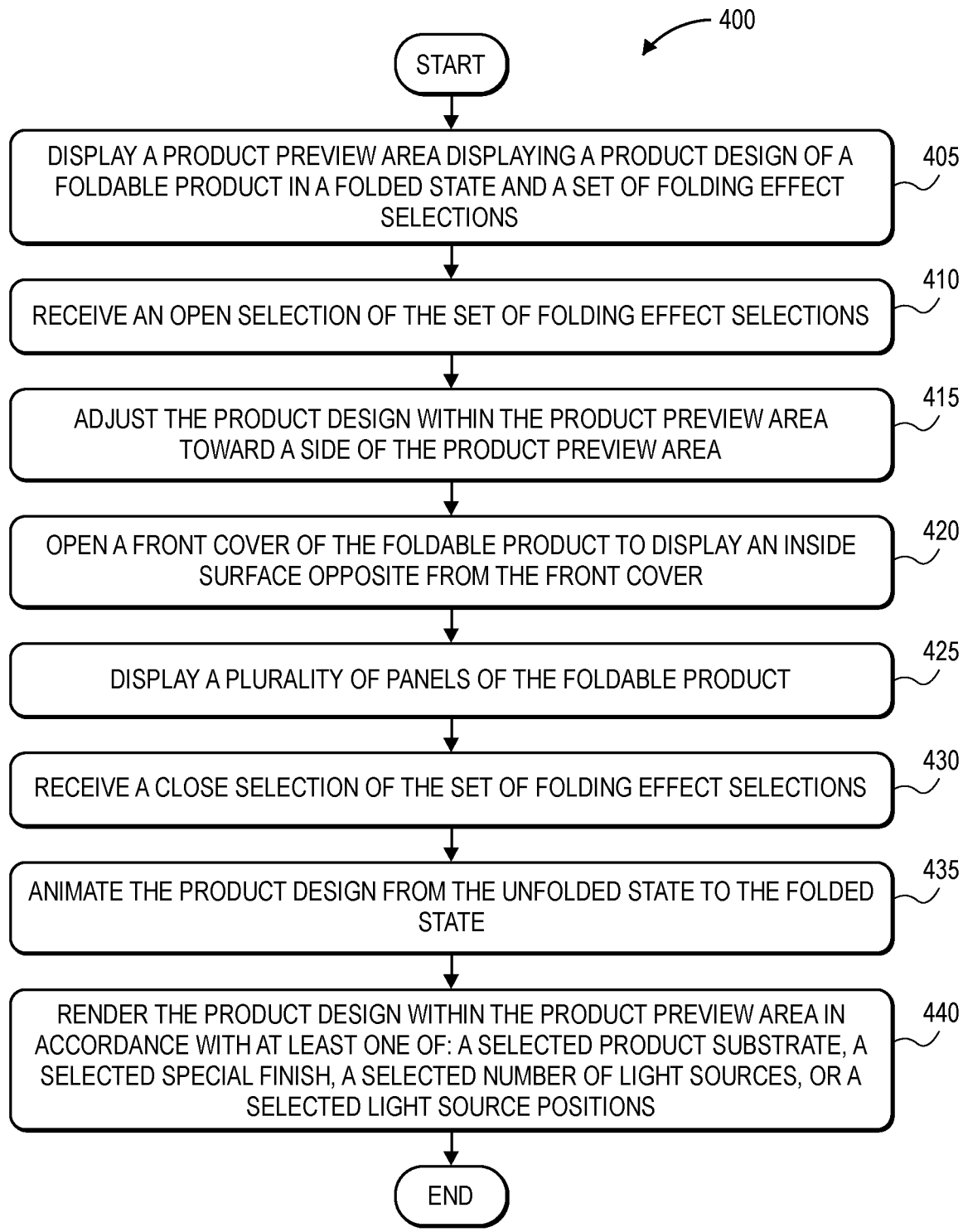
FIG. 4 is an example flow diagram associated with rendering a product design associated with a foldable product, in accordance with some embodiments.

FIG. 4 depicts is a block diagram of an example method 400 of rendering a product design associated with a foldable product. The method 400 may be facilitated by an electronic device (such as either of the devices 103, 104, 105 as depicted in FIG. 1) that may be in communication with a server (such as the central server 110 as discussed with respect to FIG. 1). In embodiments, the method 400 may be at least partially facilitated by a remote server, such as the central server 110 as discussed with respect to FIG. 1. According to embodiments, the foldable product may have a front cover and a plurality of panels.

The method 400 may begin when the electronic device displays (block 405), in a user interface, (i) a product preview area displaying the product design in a folded state with the front cover visible and substantially centered within the product preview area, and (ii) a set of folding effect selections. The electronic device may receive (block 410) an open selection of the set of folding effect selections.

In response to receiving the open selection, the electronic device may animate the product design from the folded state to an unfolded state. In particular, the electronic device may adjust (block 410) the product design within the product preview area. According to embodiments, the product design may be displayed from a perspective of a virtual camera, and adjusting the product design within the product preview area may include moving the virtual camera to cause the product design to adjust within the product preview area. The product design may adjust in various ways, such as moving or adjusting toward an edge (e.g., top, bottom, left, or right side) of the product preview area, thus enabling additional panels of the product design to be unfolded such that the unfolding product design may remain visible within the product preview area. For example, if the product design has a vertically-oriented center fold, the product design may adjust to the left side of the product preview area. For further example, if the product design has a horizontally-oriented center fold, the product design may adjust to the bottom side of the product preview area. It should be appreciated that the product design may adjust to various locations, edges, sides, or the like, of the product preview area.

Further, the electronic device may open (block 415) the front cover of the foldable product to display an inside surface opposite from the front cover. According to embodiments, the electronic device may adjust the product design within the product preview area simultaneously with opening the front cover of the foldable product. Additionally, the electronic device may display (block 420) the plurality of panels of the foldable product. Generally, in opening the front cover and displaying the plurality of panels, the electronic device may maintain the entire product design rendering so that it is completely visible within the product preview area. However, it should be appreciated that at least a portion of the product design may not be visible within the product preview area (e.g., as depicted in FIG. 3G).

In embodiments in which the foldable product has an accordion-style fold including four panels: a first panel, a second panel, a third panel, and a fourth panel, the electronic device may display the first panel and the second panel within a first side of the product preview area, and animate the third panel and the fourth panel being unfolded from under a center fold of the foldable product such that the third panel and the fourth panel are displayed within a second side of the product preview area opposite from the first side.

Alternatively, in embodiments in which the foldable product has a roll-style fold including four panels: a first panel, a second panel, a third panel, and a fourth panel, the electronic device may animate the third panel and the fourth panel being unfolded, together, from a center fold of the foldable product, and animate the fourth panel being unfolded from the third panel such that the first panel and the second panel are displayed within a first side of the product preview area, and the third panel and the fourth panel are displayed within a second side of the product preview area opposite from the first side.

Alternatively, in embodiments in which the foldable product has a roll-style fold including four panels: a first panel, a second panel, a third panel, and a fourth panel, the electronic device may display the third panel and the fourth panel folded on top of the first panel and the second panel along a center fold of the foldable product, and within a first side of the product preview area, and animate the third panel and the fourth panel being unfolded from the first panel and the second panel along the center fold such that the third panel and the fourth panel are displayed within a second side of the product preview area opposite from the first side.

The electronic device may receive (block 430) a close selection of the set of folding effect selections. In response to receiving the close selection, the electronic device may animate (block 435) the product design from the unfolded state to the folded state, wherein when the product design is displayed in the folded state, the front cover is visible and substantially centered within the product preview area.

The electronic device may also render (block 440) the product design within the product preview area in accordance with at least one of: a selected product substrate, a selected special finish, a selected number of light sources, or a selected light source position. In embodiments, the product substrate may be one of gloss, matte, film, foil, kraft, linen, natural, or pearl, and the selected special finish may be one of foil, gloss, raised, or raised foil. Other rendering parameters are also envisioned including, for example, base texture, bump map texture, bump scale, specular map, shine, reflectivity, or reflection map.

Figure 5:
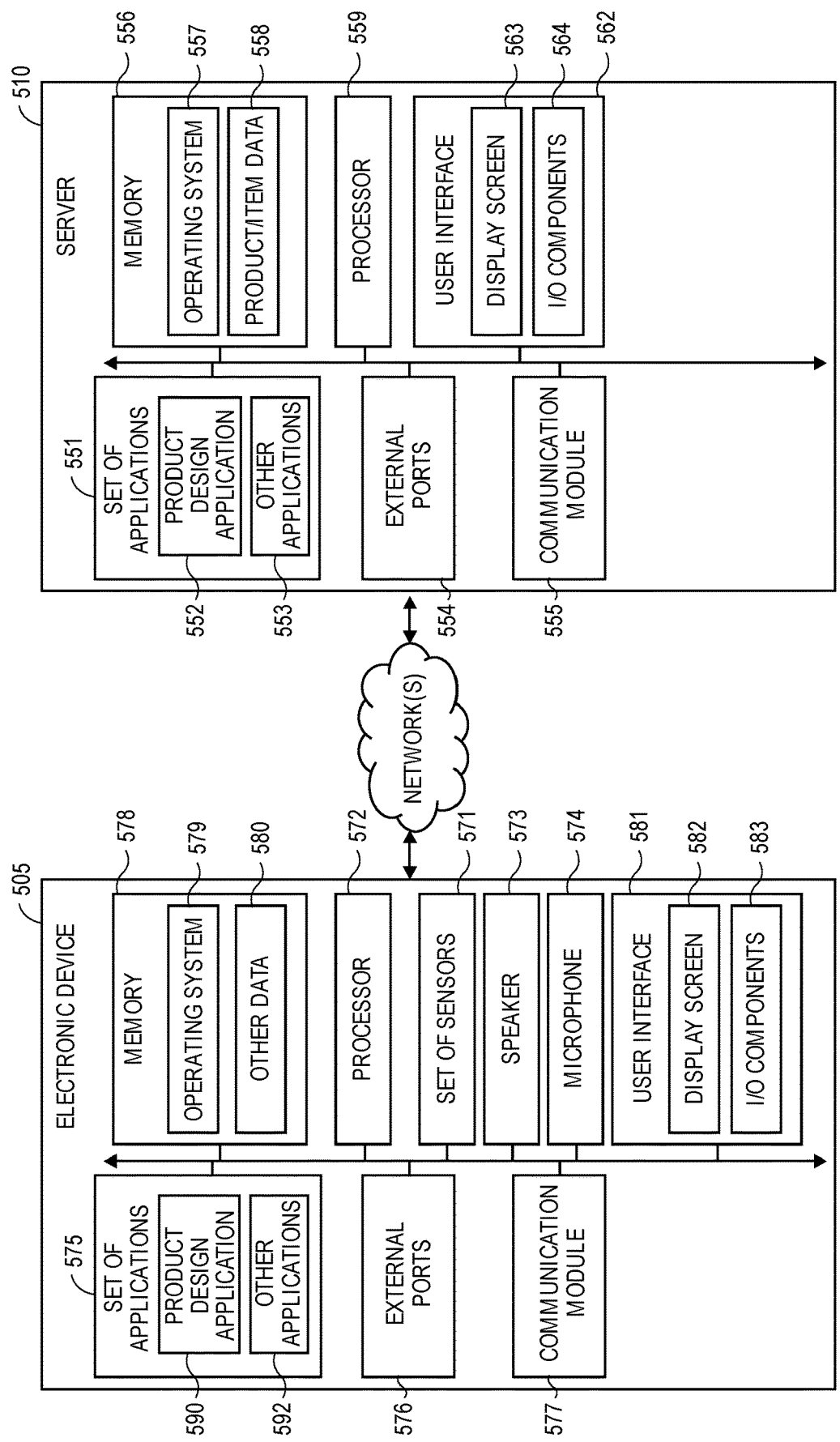
FIG. 5 is a block diagram of an example electronic device and an example server, in accordance with some embodiments.

FIG. 5 illustrates a hardware diagram of an example electronic device 505 (e.g., operated by the user to design and visualize the products described herein) and an example server 510 (e.g., used to host the websites presented to the user as disclosed herein), in which the functionalities as discussed herein may be implemented.

The electronic device 505 may include a processor 572 as well as a memory 578. The memory 578 may store an operating system 579 capable of facilitating the functionalities as discussed herein as well as a set of applications 575 (i.e., machine readable instructions). For example, one of the set of applications 575 may be a product design application 590 (such as that described hereinabove configured to facilitate certain product designing and visualization functionalities as discussed herein).

The processor 572 may interface with the memory 578 to execute the operating system 579 and the set of applications 575. According to some embodiments, the memory 578 may also store other data 580 that may include data accessed or collected by various sensors. The memory 578 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The electronic device 505 may further include a communication module 577 configured to communicate data via one or more networks 520. According to some embodiments, the communication module 577 may include one or more transceivers (e.g., WAN, WWAN, WLAN, and/or WPAN transceivers) functioning in accordance with IEEE standards, 3GPP standards, or other standards, and configured to receive and transmit data via one or more external ports 576.

The electronic device 505 may include a set of sensors 571 such as, for example, a location module (e.g., a GPS chip), an image sensor, an accelerometer, a clock, a gyroscope (i.e., an angular rate sensor), a compass, a yaw rate sensor, a tilt sensor, telematics sensors, and/or other sensors. The electronic device 505 may further include a user interface 581 configured to present information to a user and/or receive inputs from the user. As shown in FIG. 5, the user interface 581 may include a display screen 582 and I/O components 583 (e.g., ports, capacitive or resistive touch sensitive input panels, keys, buttons, lights, LEDs, and/or built in or external keyboard). According to some embodiments, the user may access the electronic device 505 via the user interface 581 to review information such product renderings, make design selections and modifications, and/or perform other functions. Additionally, the electronic device 505 may include a speaker 573 configured to output audio data and a microphone 574 configured to detect audio.

In some embodiments, the electronic device 505 may perform the functionalities as discussed herein as part of a "cloud" network or may otherwise communicate with other hardware or software components within the cloud to send, retrieve, or otherwise analyze data.

As illustrated in FIG. 5, the electronic device 505 may communicate and interface with the server 510 via the network(s) 520. The server 510 may include a processor 559 as well as a memory 556. The memory 556 may store an operating system 557 capable of facilitating the functionalities as discussed herein as well as a set of applications 551 (i.e., machine readable instructions). For example, one of the set of applications 551 may be a product design application 552 configured to facilitate various of the product design functionalities discussed herein. It should be appreciated that one or more other applications 553 are envisioned.

The processor 559 may interface with the memory 556 to execute the operating system 557 and the set of applications 551. According to some embodiments, the memory 556 may also store product/item data 558, such as data or information associated with products and items that may be offered for sale. The memory 556 may include one or more forms of volatile and/or nonvolatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The server 510 may further include a communication module 555 configured to communicate data via the one or more networks 520. According to some embodiments, the communication module 555 may include one or more transceivers (e.g., WAN, WWAN, WLAN, and/or WPAN transceivers) functioning in accordance with IEEE standards, 3GPP standards, or other standards, and configured to receive and transmit data via one or more external ports 554. For example, the communication module 555 may receive, from the electronic device 505, requests for certain design elements.

The server 510 may further include a user interface 562 configured to present information to a user and/or receive inputs from the user. As shown in FIG. 5, the user interface 562 may include a display screen 563 and I/O components 564 (e.g., ports, capacitive or resistive touch sensitive input panels, keys, buttons, lights, LEDs, external or build in keyboard). According to some embodiments, the user may access the server 510 via the user interface 562 to review information, make changes, and/or perform other functions.

In some embodiments, the server 510 may perform the functionalities as discussed herein as part of a "cloud" network or may otherwise communicate with other hardware or software components within the cloud to send, retrieve, or otherwise analyze data.

In general, a computer program product in accordance with an embodiment may include a computer usable storage medium (e.g., standard random access memory (RAM), an optical disc, a universal serial bus (USB) drive, or the like) having computer-readable program code embodied therein, wherein the computer-readable program code may be adapted to be executed by the processors 572, 559 (e.g., working in connection with the respective operating systems 579, 557) to facilitate the functions as described herein. In this regard, the program code may be implemented in any desired language, and may be implemented as machine code, assembly code, byte code, interpretable source code or the like (e.g., via Golang, Python, Scala, C, C++, Java, Actionscript, Objective-C, Javascript, CSS, XML). In some embodiments, the computer program product may be part of a cloud network of resources.

Although the following text sets forth a detailed description of numerous different embodiments, it should be understood that the legal scope of the invention may be defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a non-transitory, machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that may be permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that may be temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it may be communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment, or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment.

As used herein, the terms "comprises," "comprising," "may include," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also may include the plural unless it is obvious that it is meant otherwise.

This detailed description is to be construed as examples and does not describe every possible embodiment, as describing every possible embodiment would be impractical.

What is claimed is:

1. A method on a computing device rendering a product design associated with a foldable product having a front cover, a center fold, and a plurality of panels, the method comprising:
displaying, in a user interface of the computing device, (i) a product preview area displaying the product design in a folded state with the front cover visible and centered within the product preview area, wherein the product design is displayed from a perspective of a virtual camera, and (ii) a set of folding effect selections;
receiving, via the user interface, an open selection of the set of folding effect selections; and
in response to receiving the open selection:
determining, by a rendering application, that the product design has an accordion fold configuration, and
animating, within the product preview area by the rendering application, the product design in the accordion fold configuration from the folded state to an unfolded state to enable the product design in the unfolded state to be entirely displayed within the product preview area, including:
initially moving an origin point of the virtual camera to the right to cause the product design in the folded state to be moved toward a left edge of the product preview area such that an entirety of the product design in the folded state is displayed within a first side of the product preview area, and
after initially moving the origin point of the virtual camera to the right:
opening the front cover of the foldable product to display an inside surface opposite from the front cover, and
simultaneously with opening the front cover of the foldable product, animating at least two of the plurality of panels being unfolded from under the center fold of the foldable product such that the at least two of the plurality of panels are displayed within a second side of the product preview area opposite from the first side, wherein the initially moving the origin point of the virtual camera to the right, the opening of the front cover of the foldable product, and the animating of the at least two of the plurality of panels are done while a height of a first panel of the plurality of panels of the product design remains the same;
wherein when the product design is displayed in the unfolded state, the plurality of panels are centered within the product preview area.

2. The method of claim 1, further comprising:
receiving, via the user interface, a close selection of the set of folding effect selections; and
in response to receiving the selection, animating the product design from the unfolded state to the folded state, wherein when the product design is displayed in the folded state, the front cover is visible and substantially centered within the product preview area.

3. A system for rendering a product design associated with a foldable product having a front cover, a center fold, and a plurality of panels, comprising:
a user interface for displaying a product preview area;
a memory storing a set of computer-executable instructions; and
a processor interfacing with the user interface and the memory, and configured to execute the set of computer-executable instructions to cause the processor to:
cause the user interface to display (i) the product preview area displaying the product design in a folded state with the front cover visible and centered within the product preview area, wherein the product design is displayed from a perspective of a virtual camera, and (ii) a set of folding effect selections,
receive, via the user interface, an open selection of the set of folding effect selections, and
in response to receiving the open selection:
determine, by a rendering application executed by the processor, that the product design has an accordion fold configuration, and
cause, by the rendering application within the product preview area, the product design to be animated from the folded state to an unfolded state to enable the product design in the unfolded state to be entirely displayed within the product preview area, including:
initially moving an origin point of the virtual camera to the right to cause the product design in the folded state to be moved toward a left edge of the product preview area such that an entirety of the product design in the folded state is displayed within a first side of the product preview area, and
after initially moving the origin point of the virtual camera to the right:
opening the front cover of the foldable product to display an inside surface opposite from the front cover, and
simultaneously with opening the front cover of the foldable product, animating at least two of the plurality of panels being unfolded from under the center fold of the foldable product such that the at least two of the plurality of panels are displayed within a second side of the product preview area opposite from the first side, wherein the initially moving the origin point of the virtual camera to the right, the opening of the front cover of the foldable product, and the animating of the at least two of the plurality of panels are done while a height of a first panel of the plurality of panels of the product design remains the same;
wherein when the product design is displayed in the unfolded state, the plurality of panels are centered within the product preview area.

4. The system of claim 3, wherein the processor is further configured to:
receive, via the user interface, a close selection of the set of folding effect selections, and
in response to receiving the selection, cause the user interface to animate the product design from the unfolded state to the folded state, wherein when the product design is displayed in the folded state, the front cover is visible and substantially centered within the product preview area.

5. A non-transitory computer-readable storage medium having stored thereon a set of instructions, executable by a processor, for rendering a product design associated with a foldable product having a front cover, a center fold, and a plurality of panels, the instructions comprising:
instructions for displaying, in a user interface, (i) a product preview area displaying the product design in a folded state with the front cover visible and centered within the product preview area, wherein the product design is displayed from a perspective of a virtual camera, and (ii) a set of folding effect selections;

instructions for receiving, via the user interface, an open selection of the set of folding effect selections; and instructions for, in response to receiving the open selection:

determining, by a rendering application, that the product design has an accordion fold configuration, and animating, within the product preview area by the rendering application, the product design in the accordion fold configuration from the folded state to an unfolded state to enable the product design in the unfolded state to be entirely displayed within the product preview area, including the product design from the folded state to an unfolded state, including:

instructions for initially moving an origin point of the virtual camera to the right to cause the product design in the folded state to be moved toward a left edge of the product preview area such that an entirety of the product design in the folded state is displayed within a first side of the product preview area, and after initially moving the origin point of the virtual camera to the right:

instructions for opening the front cover of the foldable product to display an inside surface opposite from the front cover, and instructions for, simultaneously with opening the front cover of the foldable product, animating at least two of the plurality of panels being unfolded from under the center fold of the foldable product such that the at least two of the plurality of panels are displayed within a second side of the product preview area opposite from the first side, wherein the initially moving the origin point of the virtual camera to the right, the opening of the front cover of the foldable product, and the animating of the at least two of the plurality of panels are done while a height of a first panel of the plurality of panels of the product design remains the same;

wherein when the product design is displayed in the unfolded state, the plurality of panels are centered within the product preview area.

* * * * *